United States Patent
Sim et al.

(10) Patent No.: US 11,711,102 B2
(45) Date of Patent: Jul. 25, 2023

(54) LOCAL OSCILLATOR SWITCHING CONTROL FOR A VERY LOW INTERMEDIATE FREQUENCY RECEIVER

(71) Applicant: MOTOROLA SOLUTIONS, INC., Chicago, IL (US)

(72) Inventors: Moh Lim Sim, Penang (MY); Chow Loong Cheah, Kedah (MY); Jesus F. Corretjer, Ft. Lauderdale, FL (US); Kevin Doberstein, Elmhurst, IL (US); Boon Heng Fong, Penang (MY); Ariel L. Galan, Ft. Lauderdale, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 87 days.

(21) Appl. No.: 17/453,144

(22) Filed: Nov. 1, 2021

(65) Prior Publication Data
US 2023/0140647 A1    May 4, 2023

(51) Int. Cl.
| | | |
|---|---|---|
| H04B 1/10 | (2006.01) | |
| H04B 1/403 | (2015.01) | |
| H03D 3/00 | (2006.01) | |

(52) U.S. Cl.
CPC ........... *H04B 1/1027* (2013.01); *H03D 3/002* (2013.01); *H04B 1/406* (2013.01); *H03D 2200/0088* (2013.01)

(58) Field of Classification Search
CPC ............. H03D 1/1027; H03D 3/002; H03D 2200/0088; H04B 2001/1045; H04B 1/1027; H04B 1/109; H04B 1/406
See application file for complete search history.

(56) References Cited

U.S. PATENT DOCUMENTS

| | | | | |
|---|---|---|---|---|
| 5,802,463 | A | * | 9/1998 | Zuckerman ............... H03D 3/00 455/208 |
| 9,042,856 | B2 | | 5/2015 | Doberstein et al. |
| 9,503,139 | B2 | | 11/2016 | Chen et al. |
| 9,608,679 | B2 | | 3/2017 | Cheah et al. |
| 2005/0143038 | A1 | * | 6/2005 | Lafleur ..................... H04B 1/30 455/296 |
| 2011/0076976 | A1 | * | 3/2011 | Ben-Ayun ............... H04B 1/109 455/226.2 |

(Continued)

*Primary Examiner* — Khanh C Tran
(74) *Attorney, Agent, or Firm* — Michael Best & Friedrich LLP (57) ABSTRACT

A very low intermediate frequency receiver and methods for controlling the same. One method includes providing, using a local oscillator, a first intermediate frequency, detecting, using an interferer detector, an adjacent or alternate channel interference signal and an image of the adjacent or adjacent channel interference signal causing interference with a desired signal, and determining, using an electronic processor, whether the desired signal is an analog signal. In response to determining that the desired signal is an analog signal, the method includes controlling, using the electronic processor, the local oscillator to provide a second intermediate frequency. In response to determining that the desired signal is not an analog signal, the method includes determining, using the electronic processor, a switching condition based on the desired signal, and controlling, using the electronic processor, the local oscillator to provide the second intermediate frequency in response to determining the switching condition.

27 Claims, 8 Drawing Sheets

(56) References Cited

U.S. PATENT DOCUMENTS

| | | | |
|---|---|---|---|
| 2012/0129480 A1* | 5/2012 | Ruelke | H04B 1/0021 455/296 |
| 2015/0117577 A1* | 4/2015 | Valadon | H04L 27/3863 375/350 |
| 2015/0295604 A1* | 10/2015 | Cheah | H04B 1/109 375/316 |

* cited by examiner

LOCAL OSCILLATOR SWITCHING CONTROL FOR A VERY LOW INTERMEDIATE FREQUENCY RECEIVER

BACKGROUND OF THE INVENTION

Communication systems including cellular, mobile, and other wireless communication systems use assigned frequency bands for communication. Frequency bands are assigned based on the use and type of wireless communication systems. In many instances, the frequency bands may be closely located to each other, which may cause interference between the system when operating in the same location.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION OF THE INVENTION

Very low intermediate frequency (VLIF) receivers convert a received radio frequency (RF) signal to a baseband signal by combining the received RF signal with a local oscillator signal via an in-phase (I), quadrature (Q) mixer configuration prior to analog-to-digital conversion. The local oscillator is set at a frequency close to that of the RF signal but differing by an offset that is referred to as an intermediate frequency. In one example, the intermediate frequency is between 3.6 kHz and 11.4 kHz. This allows the received RF signal to be processed in a frequency region that is less affected by interfering signals.

However, even in the intermediate frequency, the VLIF receiver may experience interference from an adjacent or alternate channel interferer (ACI) signal and/or an image of the adjacent or alternate channel interference signal (which is often referred to more simply as "the image"). When the ACI signal is on one side of the center frequency ($f_c$), the image is formed on the opposite side of the center frequency at a frequency offset equal to twice the VLIF (e.g., 2×VLIF). The image is formed in the VLIF receiver due to imbalances in the in-phase and quadrature components (e.g., IQ mixer) in the VLIF receiver.

One solution to address interference due to an image is to detect the presence of the interferer that has an image falling into the desired band and trigger a change of the local oscillator frequency to operate on opposite local oscillator injection side. The change of local oscillator frequency may be performed: (i) immediately after detecting the interferer; or (ii) at a later time when natural programming of radios occurs, for example, transitions in calls by the receiver. However, each of the above options come with disadvantages. Option 1 may cause payload corruption and the switching may not be timely for option 2. Additionally, the above solution may cause chattering (frequent switching) in the presence of two interferers and may be unable to avoid the image in the presence of two interferers.

Accordingly, there is a need for local oscillator switching for a very low intermediate frequency receiver that can efficiently manage the above drawbacks.

One embodiment provides a method for controlling a very low intermediate frequency (VLIF) receiver The method includes providing, using a local oscillator, a first intermediate frequency, detecting, using an interferer detector, an adjacent or alternate channel interference signal and an image of the adjacent or adjacent channel interference signal causing interference with a desired signal, and determining, using an electronic processor, whether the desired signal is an analog signal. In response to determining that the desired signal is an analog signal, the method includes controlling, using the electronic processor, the local oscillator to provide a second intermediate frequency. In response to determining that the desired signal is not an analog signal, the method includes determining, using the electronic processor, a switching condition based on the desired signal, and controlling, using the electronic processor, the local oscillator to provide the second intermediate frequency in response to determining the switching condition.

Another embodiment provides a very low intermediate frequency receiver including a local oscillator and an electronic processor coupled to the local oscillator. The electronic processor is configured to provide, using the local oscillator, a first intermediate frequency, detect, using an interferer detector, an adjacent or alternate channel interference signal and an image or alternate of the adjacent channel interference signal causing interference with a desired signal, and determine whether the desired signal is an analog signal. In response to determining that the desired signal is an analog signal, the electronic processor is configured to control the local oscillator to provide a second intermediate frequency. In response to determining that the desired signal is not an analog signal, the electronic processor is configured to determine a switching condition based on the desired signal, and control the local oscillator to provide the second intermediate frequency in response to detecting the switching condition.

Another embodiment provides method for controlling a very low intermediate frequency (VLIF) receiver. The method includes providing, using a local oscillator, a first intermediate frequency, detecting, using an interferer detector, a far-out interference signal causing interference with a desired signal, and determining, using an electronic processor, whether the desired signal is an analog signal. In response to determining that the desired signal is an analog signal, the method includes controlling, using the electronic processor, the local oscillator to provide a second intermediate frequency. In response to determining that the desired signal is not an analog signal, the method includes determining, using the electronic processor, a switching condition based on the desired signal, and controlling, using the electronic processor, the local oscillator to provide the second intermediate frequency in response to detecting the switching condition.

Figure 1:
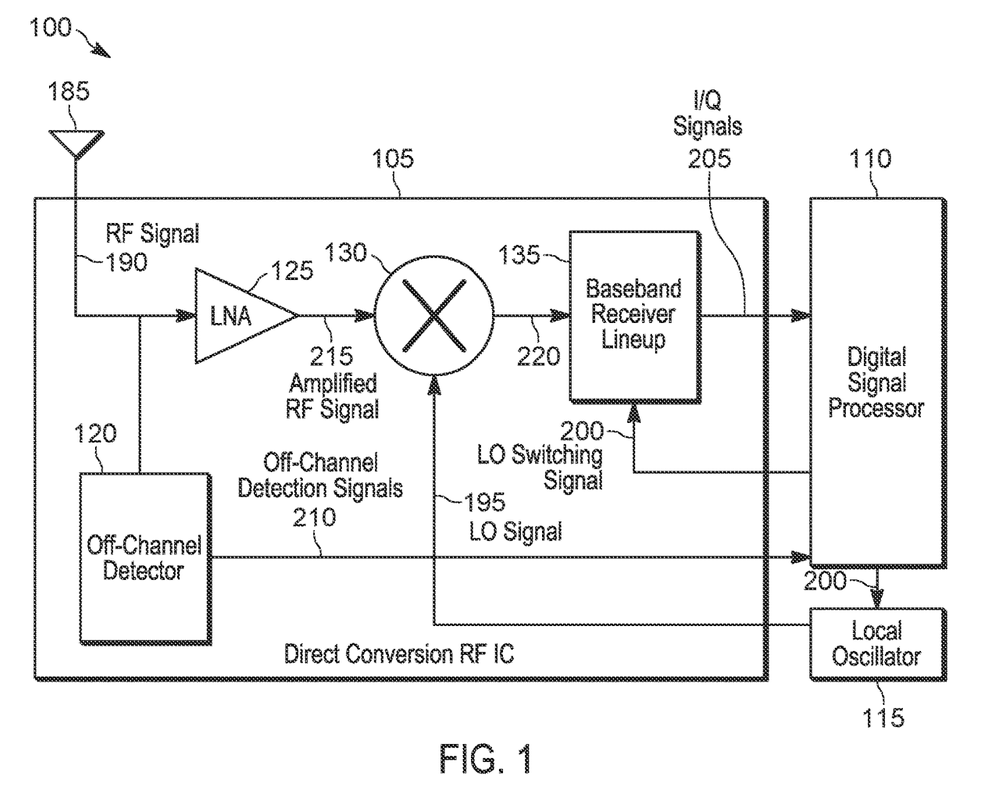
FIG. 1 is a block diagram of very low intermediate frequency receiver in accordance with some embodiments.
Figure 2:
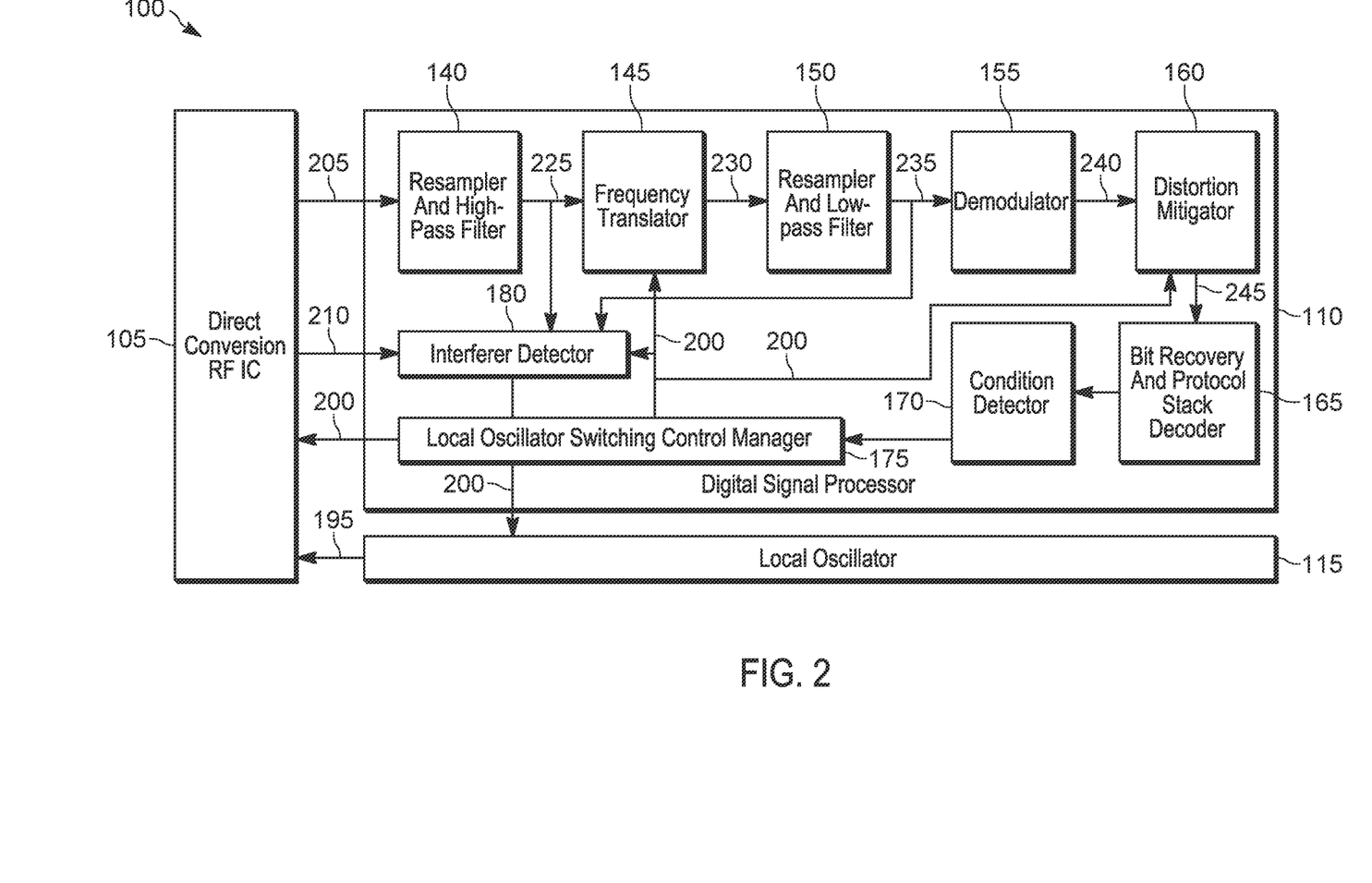
FIG. 2 is a block diagram of very low intermediate frequency receiver in accordance with some embodiments.

Very low intermediate frequency (VLIF) receivers are used in portable communication devices, for example, two-way radios, smartphones, tablet computers, laptop computers, wearable smart devices, and the like. FIGS. 1 and 2 are simplified block diagrams of an example very low intermediate frequency receiver 100 implementing local oscillator switching control. In the example illustrated, the very low intermediate frequency receiver 100 includes a direct conversion radio frequency (RF) integrated circuit (IC) 105, a digital signal processor 110, and a local oscillator 115. Through the direct conversion RF IC 105 and the digital signal processor 110, the very low intermediate frequency receiver 100 can receive and process both analog and digital radio frequency signals.

As shown in FIG. 1, the direct conversion RF IC 105 includes an off channel detector (OCD) 120, a low-noise amplifier 125, a mixer 130, and a baseband receiver lineup 135. As shown in FIG. 2, the digital signal processor 110 includes a resampler and high-pass filter 140, a frequency translator 145, a resampler and low-pass filter 150, a demodulator 155, a distortion mitigator 160, a bit recovery and protocol stack decoder 165, a condition detector 170, a local oscillator switching control manager 175, and an interferer detector 180. In some embodiments, one or more components listed above may be provided outside the direct conversion RF IC 105 and/or the digital signal processor 110. For example, the OCD 120 is provided outside the direct conversion RF IC 105 between a pre-selector and the direct conversion RF IC 105. In some embodiments, the high-pass filter 140 is a direct current (DC) notch filter.

Referring to FIG. 1, the direct conversion RF IC 105 receives as inputs a radio frequency (RF) signal 190, local oscillator (LO) signal 195, and local oscillator (LO) switching signal 200. The direct conversion RF IC 105 provides as outputs in-phase and quadrature (I/Q) signals 205 and off-channel detection signals 210. The RF signal 190 is received from an antenna 185, the LO signal 195 is received from the local oscillator 115, and the LO switching signal 200 is received from the digital signal processor 110. The I/Q signals 205 and the off-channel detection signals 210 are provided to the digital signal processor 110.

The low-noise amplifier 125 receives the RF signal 190 and outputs an amplified RF signal 215. The amplified RF signal 215 is mixed with the LO signal 195 by the mixer 130 to provide an intermediate frequency RF signal 220. The intermediate frequency RF signal 220 is split into in-phase and quadrature components (that is, the I/Q signals 205) by the baseband receiver lineup 135. The off-channel detector 120 also receives the RF signal 190 and determines whether any off-channel interference signals are present in the RF signal 190. The off-channel signal indicates the presence (or absence) of interfering signals, for example, in far-out frequency channels using the off-channel detection signals 210.

Referring to FIG. 2, the digital signal processor 110 receives as inputs the I/Q signals 205 and the off-channel detection signals 210 from the direct conversion RF IC 105. The digital signal processor 110 provides as outputs the LO switching signal 200 to the direct conversion RF IC 105 and the local oscillator 115. The I/Q signals 205 are received and filtered by the resampler and high-pass filter 140 to generate first filtered I/Q signals 225. The frequency translator 145 receives the first filtered I/Q signals 225 and performs very low intermediate frequency translation on the first filtered I/Q signals 225 to generate translated I/Q signals 230. The translated I/Q signals 230 are received and filtered by the resampler and low-pass filter 150 to generate second filtered I/Q signals 235.

The demodulator 155 demodulates the second filtered I/Q signals 235 to generate demodulated signals 240. The distortion mitigator 160 mitigates distortion in the demodulated signals 240 and generates output signals 245. The output signals 245 are processed by the bit recovery and protocol stack decoder 165. In some embodiments, the output signals 245 are processed by the bit recovery protocol stack decoder 165 when the VLIF receiver is operating in the digital mode to receive digital RF signals. When the VLIF receiver is operating in the analog mode, the output signals are processor by, for example, an analog signal conditioner. The condition detector 170 detects switching conditions, as further described below, based on the output signals 245 and provides indications of the switching conditions to the local oscillator switching control manager 175.

The interferer detector 180 receives the off-channel detection signals 210, the first filtered I/Q signals 225 and the second filtered I/Q signals 235. The interferer detector 180 detects the first signal strength (for example, E1) of the first filtered I/Q signals 225 and the second signal strength (for example, E2) of the second filtered I/Q signals 235. The interferer detector 180 determines the presence of the adjacent or alternate channel interferer or the image based on determining the difference between the first signal strength and the second signal strength (for example, E2-E1 when signal strength is measured in decibels (dB) or E1/E2 when signal strength is measured in watts (W)). The interferer detector 180 provides indications of the adjacent or alternate channel interference or the image to the local oscillator switching control manager 175.

The local oscillator switching control manager 175 generates LO switching signal 200 to control the local oscillator 115 based on the presence of the adjacent or alternate channel interference and/or the image and the switching conditions. The LO switching signal 200 is also provided to the baseband receiver lineup 135 and the frequency translator 145. The baseband receiver lineup 135 and the frequency translator 145 adjust processing of signals based on the LO switching signal 200.

The local oscillator 115 generates local oscillator signals 195 at intermediate frequencies (for example, a first intermediate frequency or a second intermediate frequency). The local oscillator 115 is controlled by the digital signal processor 110 to generate local oscillator signals 195 at different frequencies. Specifically, the local oscillator 115 changes the output frequency based on the LO switching signal 200.

FIGS. 1 and 2 illustrate only one example embodiment of the very low intermediate frequency receiver 100. The very low intermediate frequency receiver 100 may include more or fewer components and may perform additional functions other than those described herein.

Figure 3:
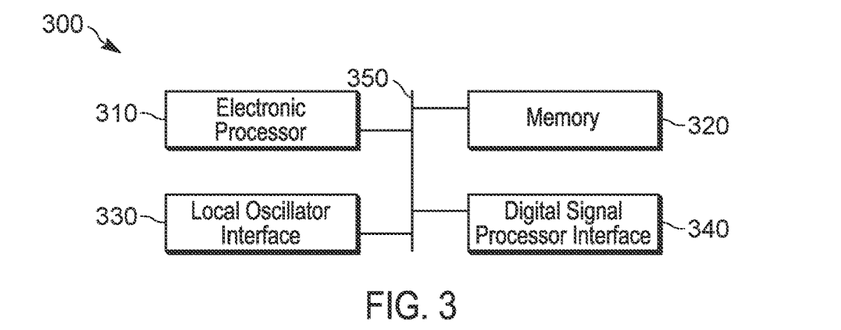
FIG. 3 is a block diagram of a processing module of the very low intermediate frequency receiver of FIGS. 1 and 2 in accordance with some embodiments.

FIG. 3 is a block diagram of an example processing module 300 of the very low intermediate frequency receiver 100. The processing module 300 may be included in the digital signal processor 110 or may be located separately from the direct conversion RF IC 105 and the digital signal processor 110. The processing module 300 provides control signals to the direct conversion RF IC 105, the digital signal processor 110, and the local oscillator 115. In the example illustrated, the processing module includes an electronic processor 310, a memory 320, a local oscillator interface 330, and a digital signal processor interface 340. The electronic processor 310, the memory 320, the local oscillator interface 330, and the digital signal processor interface 340 interface communicate over one or more control and/or data buses (for example, communication bus 350).

In some embodiments, the electronic processor 310 is implemented as a microprocessor with separate memory, for example, memory 320. In other embodiments, the electronic processor 310 is implemented as a microcontroller or digital signal processor (with memory 320 on the same chip). In other embodiments, the electronic processor 310 is implemented using multiple electronic processors. In addition, the electronic processor 310 may be implemented partially or entirely as, for example, a field programmable gate array (FPGA), an application specific integrated circuit (ASIC), and the like and the memory 320 may not be needed or be modified accordingly. In the example, the electronic processor 310 is illustrated as a separate component. However, the electronic processor 310 may be included in the same integrated circuit as the digital signal processor 110, the same integrated circuit as the direct conversion RF IC 105, and/or the like.

In the example illustrated, the memory 320 includes non-transitory, computer readable memory that stores instructions that are received and executed by the electronic processor 310 to carry out the functionality of the very low intermediate frequency receiver 100. The memory 320 may include, for example, a program storage area and a data storage area. The program storage area and the data storage area may include combinations of different types of memory, for example, read-only memory and random-access memory.

The electronic processor 310 is coupled to the local oscillator 115 over the local oscillator interface 330 and provides control signals to control the output of the local oscillator 115. Specifically, the electronic processor 310 provides control signals to the local oscillator 115 to switch the intermediate frequency output by the local oscillator 115. The electronic processor 310 is coupled to the components of the digital signal processor 110 over the digital signal processor interface 340. The electronic processor 310 receives data from the components of the digital signal processor 110, for example, from the interferer detector 180, the condition detector 170, and the local oscillator switching control manager 175 over the digital signal processor interface 340. The electronic processor 310 provides control signals to the components of the digital signal processor 110, for example, the frequency translator 145 and the distortion mitigator 160 over the digital signal processor interface 340.

In some embodiments, the local oscillator switching control manager 175 is wholly or partially implemented using the electronic processor 310.

Figure 4:
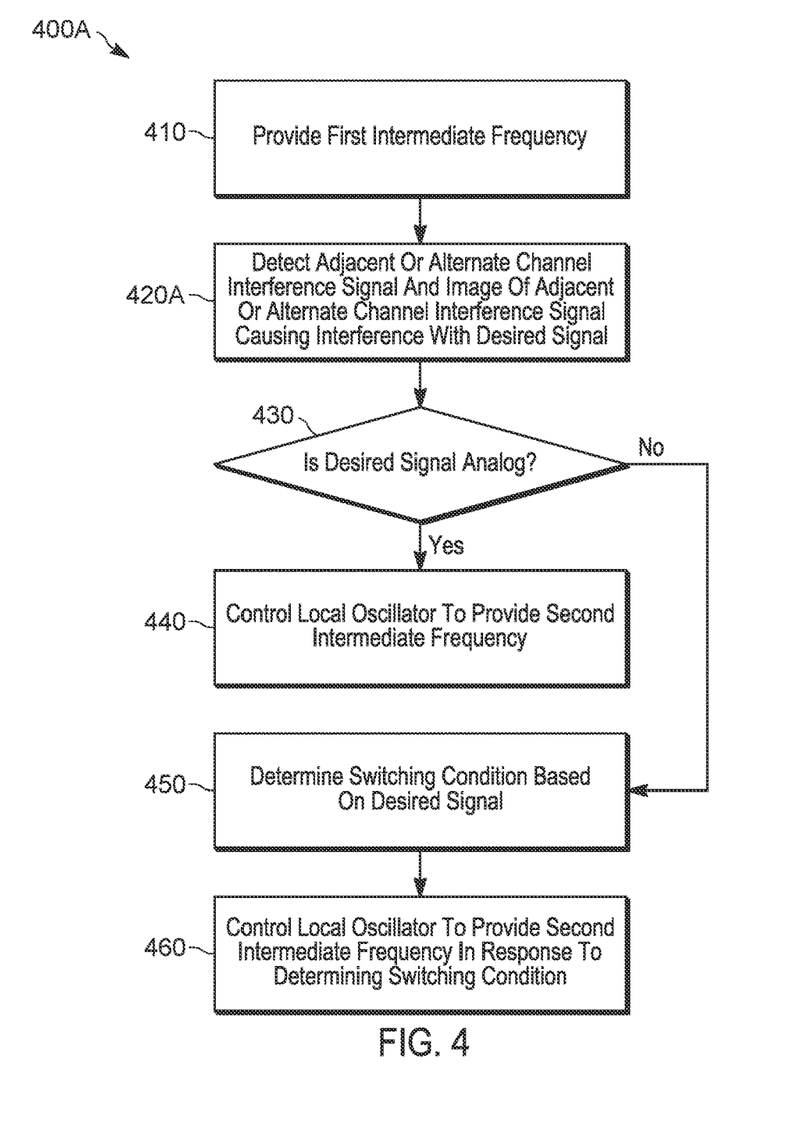
FIG. 4 is a flowchart of a method for controlling the very low intermediate frequency receiver of FIGS. 1 and 2 operating at a first intermediate frequency in accordance with some embodiments.
Figure 5:
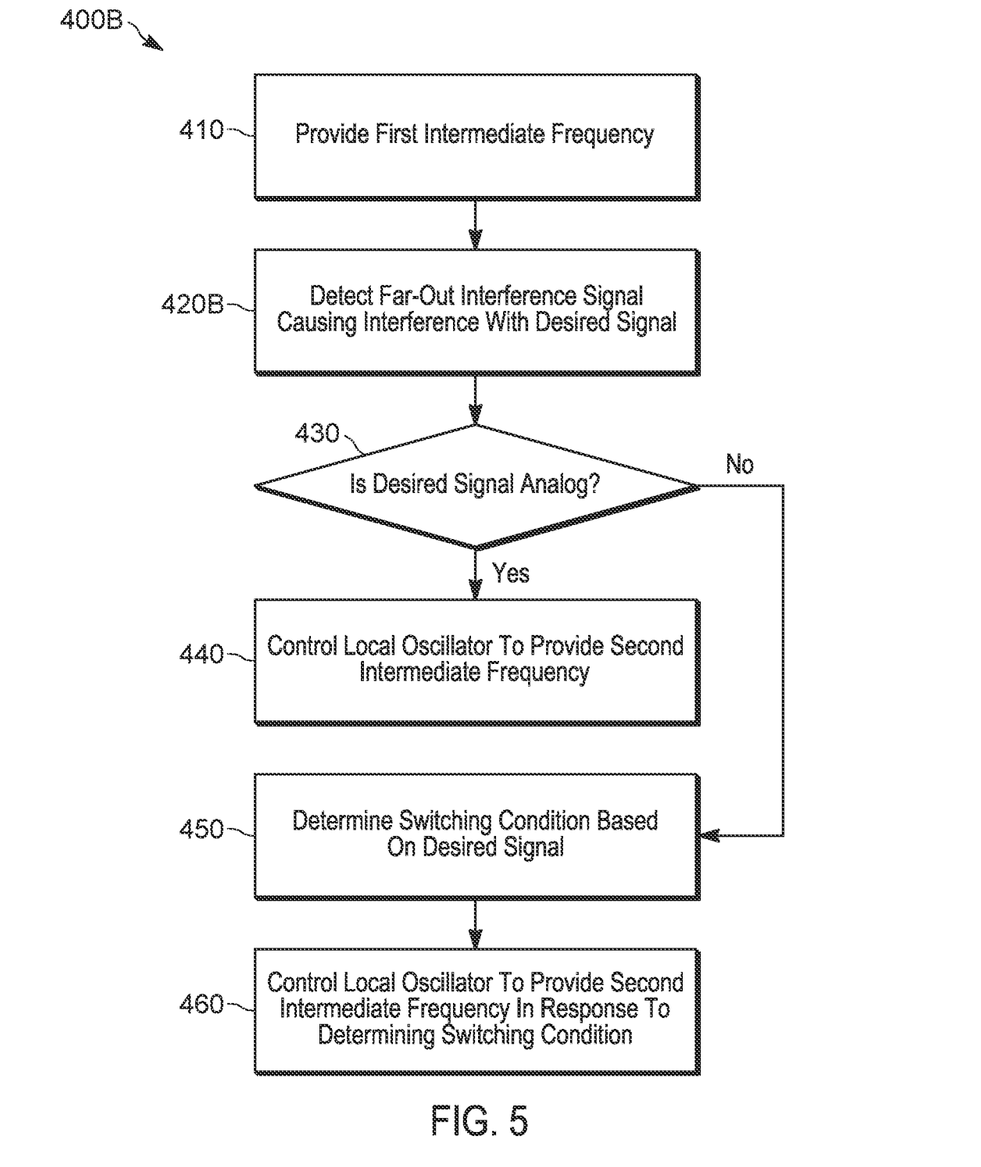
FIG. 5 is a flowchart of a method for controlling the very low intermediate frequency receiver of FIGS. 1 and 2 operating at a first intermediate frequency in accordance with some embodiments.

FIGS. 4 and 5 are flowcharts of example methods 400A and 400B for controlling the very low intermediate frequency receiver 100. The methods 400A and 400B include common blocks and are singularly referred to as a method 400 when describing the common blocks. In the example illustrated, the method 400 includes providing, using the local oscillator 115, a first intermediate frequency (at block 410). The electronic processor 310 control the local oscillator 115 to provide the first intermediate frequency to the mixer 130. The first intermediate frequency is, for example, an initial frequency for operation of the very low intermediate frequency receiver 100 prior to detecting any interference.

The method 400A (FIG. 4) includes detecting, using the interferer detector 180, an adjacent or alternate (for example, adjacent to the adjacent channel) channel interference and an image of the adjacent or alternate channel interference signal causing interference with a desired signal (at block 420A). In one example, the interferer detector 180 receives the IQ signals 225 and performs frequency domain analysis using Fast Fourier Transform (FFT) to determine whether the IQ signals 225 contain signals at an adjacent or alternate channel frequency. The interfere detector 180 determines whether the power of the adjacent or alternate frequency signals exceeds a predetermined threshold. The interferer detector 180 further detects whether the image of the adjacent or alternate channel signal is causing an interference with the desired signal (that is, the signal in the desired band) by determining whether the power of the image exceeds a predetermined threshold. In another example, the interferer detector 180 detects interference by comparing the first signal strength (for example, E1) of a first filtered signal before frequency translation with the second signal strength (for example, E2) of a second filtered signal after frequency translation. The interference is detected when the difference between the first signal strength and the second signal strength satisfies a threshold condition.

The method 400B (FIG. 5) includes detecting, using the off-channel detector 120, a far-out interference signal causing interference with a desired signal (at block 420B). The off-channel detector 120 receives the RF signal 190 and determines whether the RF signal 190 includes signals from far-out frequency channels (for example, in a band with multiple channel frequency separation from the desired frequency). The off-channel detector 120 provides indications of presence of strong far-out channels to the interferer detector 180. The interferer detector 180 detects whether the presence of the far-out channel signal is causing an interference with the desired signal (that is, the signal in the desired band). In one example, the interferer detector 180 detects interference when the first signal strength (that is, E1) is below a predetermined threshold.

The method 400 includes determining, using the electronic processor 310, whether the desired signal is an analog signal (at block 430). The very low intermediate frequency receiver 100 can receive and process both analog and digital radio frequency signals. The very low intermediate frequency receiver 100 is tuned based on the application to receive an analog RF signal and/or a digital RF signal. The electronic processor 310 may have a-priori knowledge of the current process of the very low intermediate frequency based on, for example, the current tuning of the very low intermediate frequency receiver 100.

In response to determining that the desired signal is an analog signal, the method 400 includes controlling, using the electronic processor 310, the local oscillator 115 to provide a second intermediate frequency (at block 440). The electronic processor 310 immediately controls the local oscillator 115 to provide the second intermediate frequency, for example, without waiting for a switching condition as discussed below. The second intermediate frequency is selected to reduce interference from the image of the adjacent channel signal. In some embodiments, the method 400 further includes performing, using the distortion mitigator 160 (for example, a spike suppressor), distortion mitigation of spikes caused by switching from the first intermediate frequency to the second intermediate frequency when the desired signal is an analog signal.

Figure 8A:
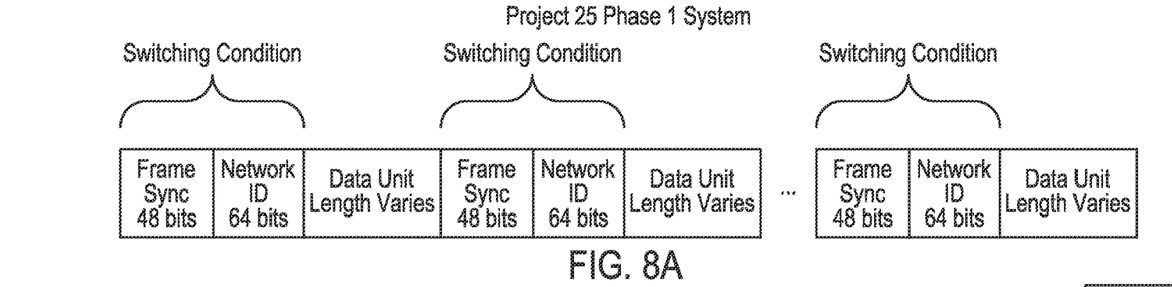
FIGS. 8A-8C illustrate possible switching conditions of the very low intermediate frequency receiver of FIGS. 1 and 2 in accordance with some embodiments.
Figure 8B:
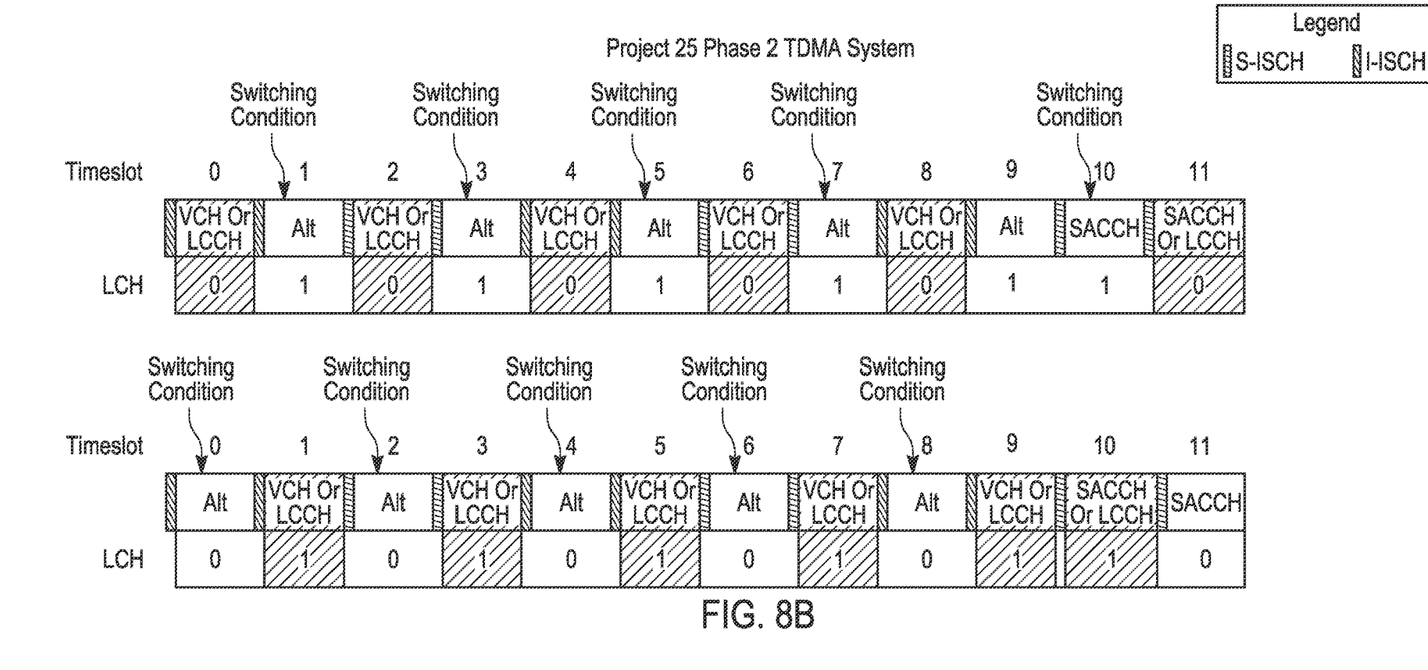
Figure 8C:
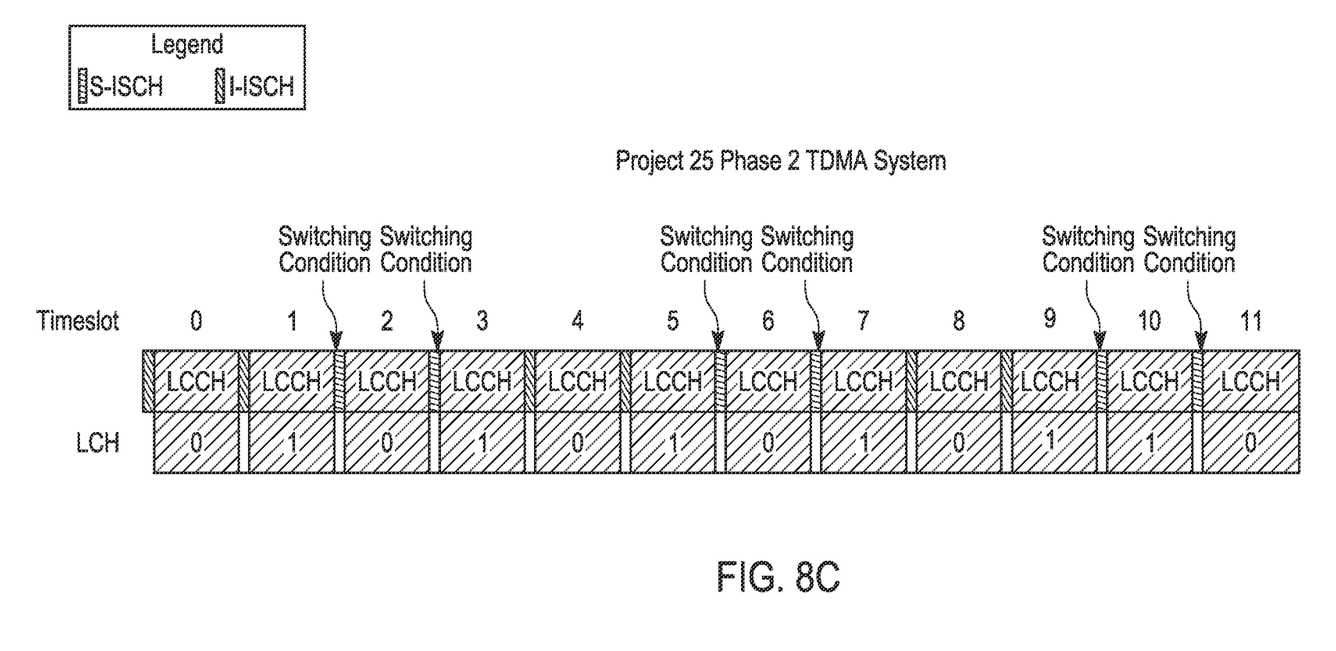

In response to determining that the desired signal is not an analog signal (that is, the desired signal is a digital signal), the method 400 includes detecting, using the electronic processor 310, a switching condition based on the desired signal (at block 450). The condition detector 170 monitors the desired signal to detect optimal switching conditions that cause minimal disruption to the current call of the portable communications device. In some embodiments, the condition detector 170 has a-priori knowledge of the switching condition. Determining the switching condition includes one or more of predicting a frame synchronization word in the desired signal (shown in FIG. 8A), predicting a network identifier in the desired signal (shown in FIG. 8A), predicting a timeslot of a time divisional multiple access (TDMA) system assigned for another receiver (shown in FIG. 8B), predicting an inactive timeslot of a TDMA system (shown in FIG. 8B), and predicting absence of carrier in the desired signal (shown in FIG. 8C). Predicting of the switching conditions includes predicting a location and/or timing or the switching condition based on, for example, a-prior knowledge and/or historical pattern of the signals. The frame synchronization word is a Phase 1 standard frame synchronization word, a Phase 2 standard inter slot signaling channel (ISCH) frame synchronization word, or the like. FIGS. 8A-8C illustrate the possible switching conditions where the switching from the first intermediate frequency to the second intermediate frequency may be performed. FIG. 8A illustrates an example of the location and/or timing of a frame synchronization word and a network identified in a Project 25 Phase 1 standard signal. FIG. 8B illustrates an example of the location and/or timing of a timeslot of a Project 25 Phase 2 TDMA assigned for another receiver. FIG. 8C illustrates an example of the location and/or timing of the absence of carrier in the desired signal of a Project 25 Phase 2 dual slot TDMA signal. As can be seen from FIGS. 8A-8C, the switching conditions can be detected at predictable locations. The electronic processor 310 is therefore able to predict when the next switching condition will occur.

In response to determining that the desired signal is not an analog signal, the method 400 also includes controlling, using the electronic processor, the local oscillator to provide the second intermediate frequency in response to detecting the switching condition (at block 460). The electronic processor 310 controls the local oscillator 115 to switch the output from the first intermediate frequency to the second intermediate frequency when the switching condition occurs. In some embodiments, the method 400 also includes reconfiguring the VLIF receiver 100 after switching the local oscillator 115 output frequency as further described below with respect to FIG. 6. The electronic processor 310 reconfigures the VLIF receiver 100 a fixed time interval after block 440 and/or block 460. The local oscillator 115 output frequency includes a center frequency ($F_c$) and a frequency offset ($F_{offset}$). The center frequency corresponds to, for example, the frequency of the desired signal. The frequency offset is provided to translate the desired signal to an intermediate frequency. Accordingly, the first intermediate frequency includes a first $F_{offset}$ added to a first Fe and the second intermediate frequency includes a second $F_{offset}$ added to a second $F_c$.

Different modes may be used to switch the intermediate frequency. In one example, a toggling mode may be used. In the toggling mode, the first intermediate frequency is set to $F_c+F_{offset}$ and the second intermediate frequency is set to $F_c-F_{offset}$. That is, the second $F_{offset}$ is the negative of the first $F_{offset}$. In another example, a dynamic mode with a default high offset may be used. The dynamic mode with a default high offset initially works similarly as the toggling mode. That is, the first intermediate frequency is set to $F_c+F_{offset}$ and the second intermediate frequency is set to $F_c-F_{offset}$ for a first few instances of detecting interference. The intermediate frequency toggles between the first intermediate frequency and the second intermediate frequency for the first few instances (for example, first four instances) of detecting the interference. However, when a predetermined number of instances of the adjacent or alternate channel interference signal are detected, the electronic processor 310 switches an absolute value of the second $F_{offset}$ to be lower than an absolute value of the first $F_{offset}$. For example, the first $F_{offset}$ is 11.4 kHz and the second $F_{offset}$ may be changed to 3.7 kHz, 4.4 kHz, or 5.7 kHz depending on the number of instances of interference detected. When the predetermined number of instances of the adjacent or alternate channel interference signal are detected, the electronic processor 310 also switches baseband settings from a wideband setting to a narrowband setting. For example, the electronic processor 310 uses wideband setting for an $F_{offset}$ of 11.4 kHz and uses narrowband setting for $F_{offset}$ of below 11.4 kHz.

In yet another example, a dynamic mode with a default low offset may be used. The dynamic mode with a default low offset works similarly as the dynamic mode with a default high offset. However, the initial $F_{offset}$ is set to 3.7 kHz, 4.4 kHz, or 5.7 kHz and later increased based on detecting a predetermined number of instances of the far-out channel interference signal.

Figure 6:
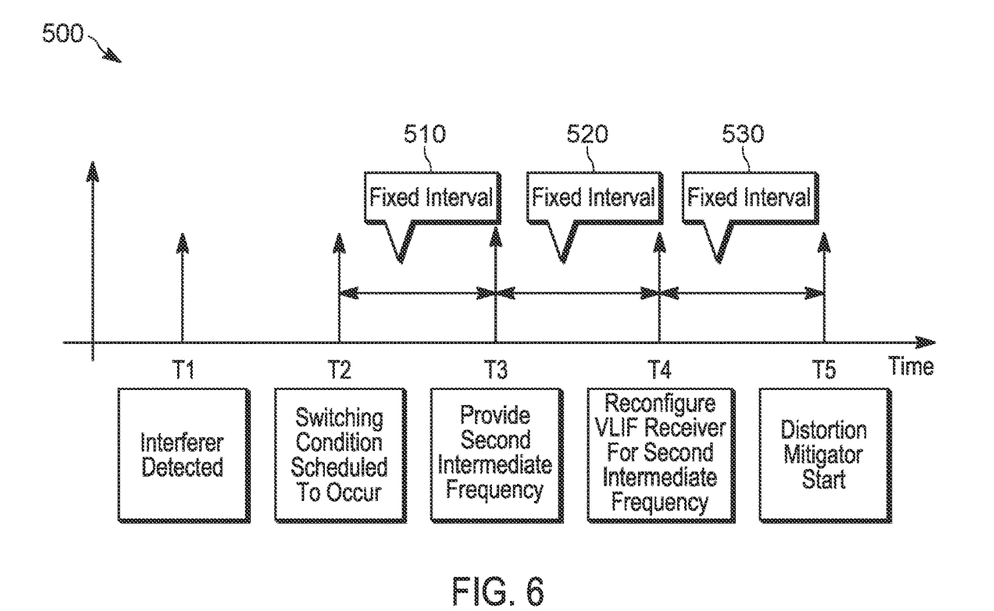
FIG. 6 is a timing diagram of controlling a local oscillator of the very low intermediate frequency receiver of FIGS. 1 and 2 in accordance with some embodiments.

FIG. 6 is an example timing diagram 500 for controlling the switching of local oscillator 115 output. In the example timing diagram 500, the interferer detector 180 detects the image interfering with the desired signal at time T1. The interferer detector 180 provides an indication of the interferer to the local oscillator switching control manager 175 and/or the electronic processor 310. The condition detector 170 provides an indication that a switching condition is scheduled to occur at time T2. The electronic processor 310 controls the local oscillator 115 to provide the second intermediate frequency a first fixed time interval 510 after determining the switching condition (that is, at time T3).

A second fixed time interval 520 after controlling the local oscillator to provide the second intermediate frequency, the electronic processor 310 reconfigures the very low intermediate frequency receiver 100 to operate using the second intermediate frequency (that is, at time T4). Reconfiguring the very low intermediate frequency receiver 100 may include switching, using the electronic processor 310, receiver setting of the very low intermediate frequency receiver to operate at the second intermediate frequency. Reconfiguring the very low intermediate frequency receiver 100 may also include switching, using the electronic processor 310, baseband setting to operate at the second intermediate frequency. Specifically, the local oscillator switching control manager 175 provides LO switching signals to the baseband receiver lineup 135 and the frequency translator 145 to reconfigure the very low intermediate frequency receiver 100. Reconfiguring may also include changing the filter bandwidth and amplifier gain according to the changed intermediate frequency.

A third fixed time interval 530 after switching the baseband settings, the electronic processor 310 commences distortion mitigation caused by switching from the first intermediate frequency to the second intermediate frequency (that is, at time T5). The electronic processor 310 controls the distortion mitigator 160 to suppress any spikes caused by the switching of the local oscillator 115 frequency.

Figure 7A:
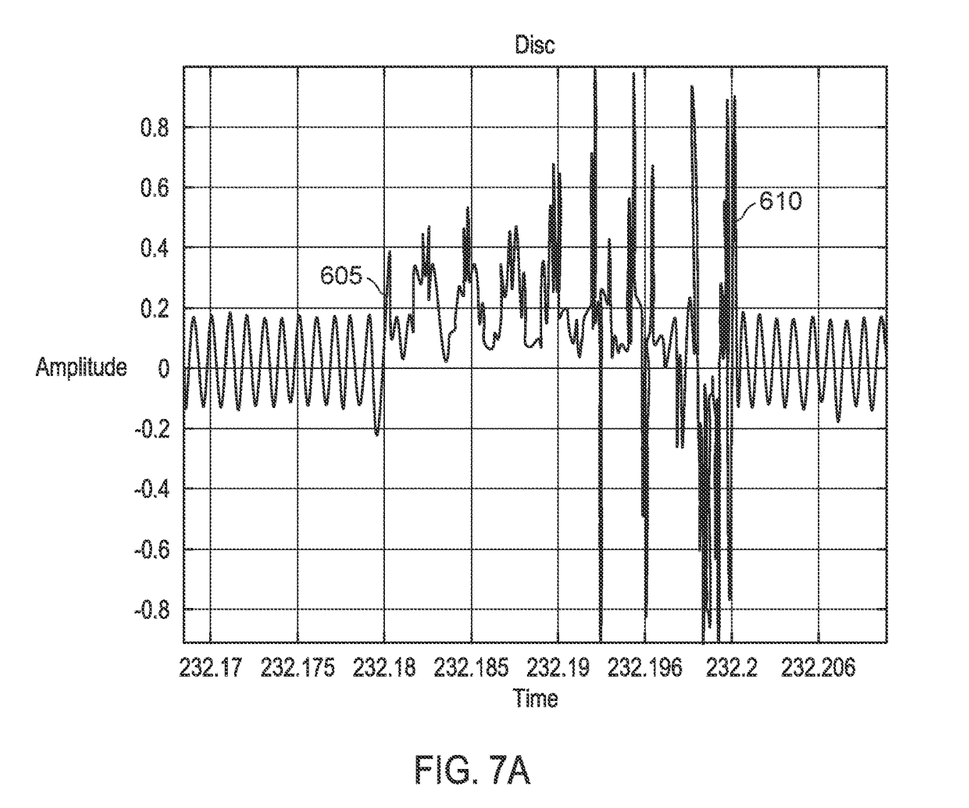
FIGS. 7A and 7B are graphical representations of a received signal illustrating the effect of a spike suppressor in accordance with some embodiments.
Figure 7B:
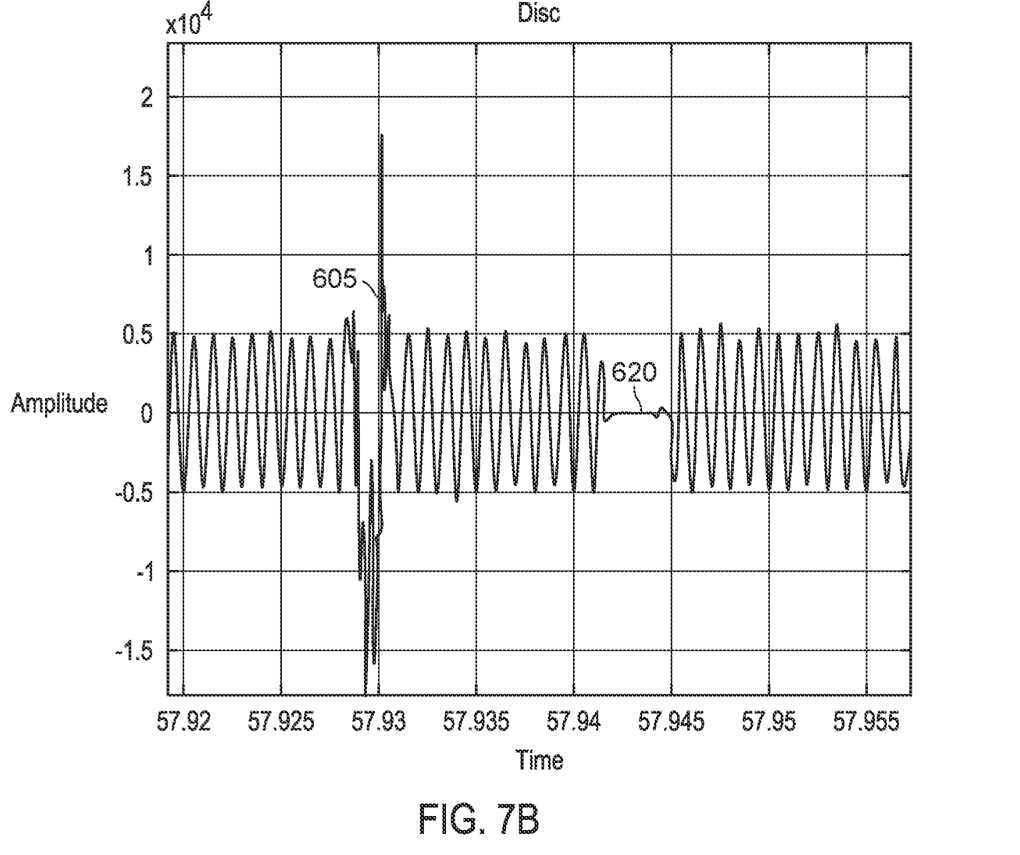

FIGS. 7A and 7B illustrate the effect of the distortion mitigator 160. The electronic processor 310 predicts the timing at which a spike in the desired signal is set to occur based on the switching of the local oscillator 115 intermediate frequency. In FIGS. 7A and 7B, amplitude is illustrated on the Y-axis and timing is illustrated on the X-axis. For example, as shown in FIG. 7A, when an interferer is detected at 605 a spike 610 occurs in the received signal due to the switching of the local oscillator 115 intermediate frequency. The electronic processor 310 controls the distortion mitigator 160 to suppress the spike when switching occurs from the first intermediate frequency to the second intermediate frequency. As shown in FIG. 7B, the spike is suppressed at 720 such that a smooth transition can be achieved from the first intermediate frequency to the second intermediate frequency.

The above methods provide several advantages. Specifically, the above methods allow for timely switching without having to wait for natural radio mode transition programming. Additionally, the above methods will not cause payload corruption because a gating mechanism (that is, switching conditions) are used to perform switching between intermediate frequencies. The above method prevents chattering (that is, frequent switching in the presence of two interferers.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A method for controlling a very low intermediate frequency (VLIF) receiver, the method comprising:
   providing, using a local oscillator, a first intermediate frequency;
   detecting, using an interferer detector, an adjacent or alternate channel interference signal and an image of the adjacent or adjacent channel interference signal causing interference with a desired signal;
   determining, using an electronic processor, whether the desired signal is an analog signal;
   in response to determining that the desired signal is an analog signal
      controlling, using the electronic processor, the local oscillator to provide a second intermediate frequency;
   in response to determining that the desired signal is not an analog signal
      determining, using the electronic processor, a switching condition based on the desired signal; and
      controlling, using the electronic processor, the local oscillator to provide the second intermediate frequency in response to determining the switching condition.

2. The method of claim 1, wherein determining the switching condition includes one selected from a group consisting of predicting a frame synchronization word in the desired signal, detecting a network identifier in the desired signal, predicting a timeslot of a time divisional multiple access (TDMA) system assigned for another receiver, predicting an inactive timeslot of a TDMA system, and predicting absence of carrier in the desired signal.

3. The method of claim 1, further comprising:
   performing, using a spike suppressor, distortion mitigation of spikes caused by switching from the first intermediate frequency to the second intermediate frequency when the desired signal is an analog signal.

4. The method of claim 3, further comprising controlling the local oscillator to provide the second intermediate frequency a first fixed time interval after determining the switching condition.

5. The method of claim 4, further comprising:
   a second fixed time interval after controlling the local oscillator to provide the second intermediate frequency,
      switching, using the electronic processor, receiver settings of the VLIF receiver to operate at the second intermediate frequency; and
      switching, using the electronic processor, baseband settings to operate at the second intermediate frequency.

6. The method of claim 5, further comprising:
   a third fixed time interval after switching the baseband settings,
      commencing distortion mitigation of spikes caused by switching from the first intermediate frequency to the second intermediate frequency.

7. The method of claim 1, wherein an output frequency of the local oscillator includes a center frequency ($F_c$) and a frequency offset ($F_{offset}$), wherein the first intermediate frequency includes a first $F_{offset}$ added to a first $F_c$ and the second intermediate frequency includes a second $F_{offset}$ added to the first $F_c$.

8. The method of claim 7, wherein the second $F_{offset}$ is a negative of the first $F_{offset}$.

9. The method of claim 8, wherein when a predetermined number of instances of the adjacent channel interference signal are detected, the method further comprising:
   switching an absolute value of the second $F_{offset}$ to be lower than an absolute value of the first $F_{offset}$; and
   switching, using the electronic processor, baseband settings from a wideband setting to a narrowband setting.

10. A very low intermediate frequency receiver comprising:
    a local oscillator;
    an electronic processor coupled to the local oscillator and configured to
       provide, using the local oscillator, a first intermediate frequency;
       detect, using an interferer detector, an adjacent or alternate channel interference signal and an image or alternate of the adjacent channel interference signal causing interference with a desired signal;
       determine whether the desired signal is an analog signal;
       in response to determining that the desired signal is an analog signal
          control the local oscillator to provide a second intermediate frequency;
       in response to determining that the desired signal is not an analog signal
          determine a switching condition based on the desired signal; and
          control the local oscillator to provide the second intermediate frequency in response to detecting the switching condition.

11. The very low intermediate frequency receiver of claim 10, wherein determining the switching condition includes one selected from a group consisting of predicting a frame synchronization word in the desired signal, predicting a network identifier in the desired signal, predicting a timeslot of a time divisional multiple access (TDMA) system assigned for another receiver, predicting an inactive timeslot of a TDMA system, and detecting absence of carrier in the desired signal.

12. The very low intermediate frequency receiver of claim 10, wherein the electronic processor is further configured to perform, using a spike suppressor, distortion mitigation of spikes caused by switching from the first intermediate frequency to the second intermediate frequency when the desired signal is an analog signal.

13. The very low intermediate frequency receiver of claim 12, wherein the electronic processor is further configured to control the local oscillator to provide the second intermediate frequency a first fixed time interval after determining the switching condition.

14. The very low intermediate frequency receiver of claim 13, wherein the electronic processor is further configured to
    a second fixed time interval after controlling the local oscillator to provide the second intermediate frequency,
       switch receiver settings of the VLIF receiver to operate at the second intermediate frequency; and
       switch baseband settings to operate at the second intermediate frequency.

15. The very low intermediate frequency receiver of claim 14, wherein the electronic processor is further configured to
    a third fixed time interval after switching the baseband settings,
       commence distortion mitigation of spikes caused by switching from the first intermediate frequency to the second intermediate frequency.

16. The very low intermediate frequency receiver of claim 10, wherein an output frequency of the local oscillator includes a center frequency ($F_c$) and a frequency offset ($F_{offset}$), wherein the first intermediate frequency includes a first $F_{offset}$ added to a first $F_c$ and the second intermediate frequency includes a second $F_{offset}$ added to the first $F_c$.

17. The very low intermediate frequency receiver of claim 16, wherein the second $F_{offset}$ is a negative of the first $F_{offset}$.

18. The very low intermediate frequency receiver of claim 17, wherein when a predetermined number of instances of the adjacent channel interference signal are detected, the electronic processor is further configured to
- switch an absolute value of the second $F_{offset}$ to be lower than an absolute value of the first $F_{offset}$; and
- switch baseband settings from a wideband setting to a narrowband setting.

19. A method for controlling a very low intermediate frequency (VLIF) receiver, the method comprising:
- providing, using a local oscillator, a first intermediate frequency;
- detecting, using an interferer detector, a far-out interference signal causing interference with a desired signal;
- determining, using an electronic processor, whether the desired signal is an analog signal;
- in response to determining that the desired signal is an analog signal
  - controlling, using the electronic processor, the local oscillator to provide a second intermediate frequency;
- in response to determining that the desired signal is not an analog signal
  - determining, using the electronic processor, a switching condition based on the desired signal; and
  - controlling, using the electronic processor, the local oscillator to provide the second intermediate frequency in response to detecting the switching condition.

20. The method of claim 19, wherein determining the switching condition includes one selected from a group consisting of predicting a frame synchronization word in the desired signal, predicting a network identifier in the desired signal, predicting a timeslot of a time divisional multiple access (TDMA) system assigned for another receiver, predicting an inactive timeslot of a TDMA system, and detecting absence of carrier in the desired signal.

21. The method of claim 19, further comprising:
- performing, using a spike suppressor, distortion mitigation of spikes caused by switching from the first intermediate frequency to the second intermediate frequency when the desired signal is an analog signal.

22. The method of claim 21, further comprising controlling the local oscillator to provide the second intermediate frequency a first fixed time interval after determining the switching condition.

23. The method of claim 22, further comprising:
- a second fixed time interval after controlling the local oscillator to provide the second intermediate frequency,
  - switching, using the electronic processor, receiver settings of the VLIF receiver to operate at the second intermediate frequency; and
  - switching, using the electronic processor, baseband settings to operate at the second intermediate frequency.

24. The method of claim 23, further comprising:
- a third fixed time interval after switching the baseband settings,
  - commencing distortion mitigation of spikes caused by switching from the first intermediate frequency to the second intermediate frequency.

25. The method of claim 19, wherein an output frequency of the local oscillator includes a center frequency ($F_c$) and a frequency offset ($F_{offset}$), wherein the first intermediate frequency includes a first $F_{offset}$ added to a first $F_c$ and the second intermediate frequency includes a second $F_{offset}$ added to the first $F_c$.

26. The method of claim 25, wherein the second $F_{offset}$ is a negative of the first $F_{offset}$.

27. The method of claim 26, wherein when a predetermined number of instances of the far-out interference signal are detected, the method further comprising:
- switching an absolute value of the second $F_{offset}$ to be higher than an absolute value of the first $F_{offset}$; and
- switching, using the electronic processor, baseband settings from a narrowband setting to a wideband setting.

* * * * *